United States Patent [19]

Kurosawa

[11] Patent Number: 4,896,272

[45] Date of Patent: Jan. 23, 1990

[54] COMPUTER-CONTROLLED AUTOMATIC LOGIC DESIGN SYSTEM FOR SEMICONDUCTOR INTEGRATED CIRCUIT DEVICES

[75] Inventor: Yuichi Kurosawa, Tokyo, Japan

[73] Assignee: Kabushiki Kaisha Toshiba, Kawasaki, Japan

[21] Appl. No.: 175,288

[22] Filed: Mar. 30, 1988

[30] Foreign Application Priority Data

Mar. 31, 1987 [JP] Japan ................... 62-76204

[51] Int. Cl.[4] .................. G06F 15/60; G06F 15/20
[52] U.S. Cl. ...................... 364/491; 364/490; 364/489; 364/488
[58] Field of Search ............ 364/488, 489, 490, 491, 364/300, 521

[56] References Cited

U.S. PATENT DOCUMENTS

| | | | |
|---|---|---|---|
| 4,577,276 | 3/1986 | Dunlop et al. | 364/491 |
| 4,593,363 | 6/1986 | Burstein et al. | 364/491 |
| 4,612,618 | 9/1986 | Pryor et al. | 364/488 |
| 4,630,219 | 12/1986 | DiGiacomo et al. | 364/491 |
| 4,636,966 | 1/1987 | Yamada et al. | 364/491 |
| 4,656,603 | 4/1987 | Dunn | 364/488 |
| 4,703,435 | 10/1987 | Darringer et al. | 364/489 |
| 4,813,013 | 3/1989 | Dunn | 364/488 |
| 4,827,427 | 5/1989 | Hyduke | 364/489 |
| 4,833,619 | 5/1989 | Shimizu et al. | 364/489 |

FOREIGN PATENT DOCUMENTS 6033667  2/1985  Japan .

OTHER PUBLICATIONS

Proceedings of ISCAS 85 (pp. 651-654); I. Matsumoto et al, (NEC); 1985.
15th DAC (pp. 271-277); T. M. McWilliams and L. C. Widdoes, Jr.; 1978.

Primary Examiner—Parshotam S. Lall
Assistant Examiner—V. N. Trans
Attorney, Agent, or Firm—Oblon, Spivak, McClelland, Maier & Neustadt

[57] ABSTRACT

There is disclosed a specific automatic logic design technique according to which, first, an initial logic circuit, which is automatically synthesized based on a "hardware description language" and using standard logic elements stored in advance as a library, is stored in a data storage unit. The logic circuit is displayed on a display device to permit an operator to assign, by using a block assignment unit, logic elements that must be grouped together as a single circuit block from the logic elements constituting the logic circuit so that the actual design conditions including restrictions for placement and wiring are satisfied. When the logic elements to be grouped together are assigned, they are combined as a circuit block before the logic circuit is subjected to automatic layout optimization processing. The logic circuit is rearranged to include the circuit block as a circuit section having a fixed internal circuit configuration. The circuit block is prohibited from being divided into several portions in the final automatic layout optimization processing.

9 Claims, 4 Drawing Sheets

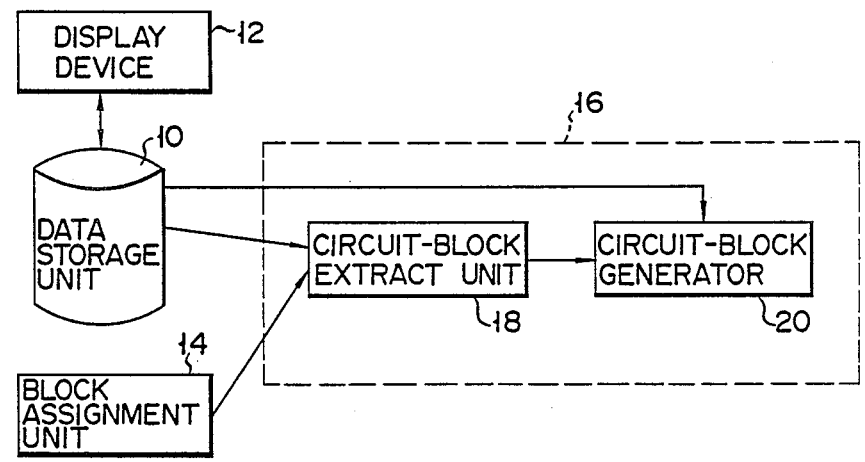
F I G. 1
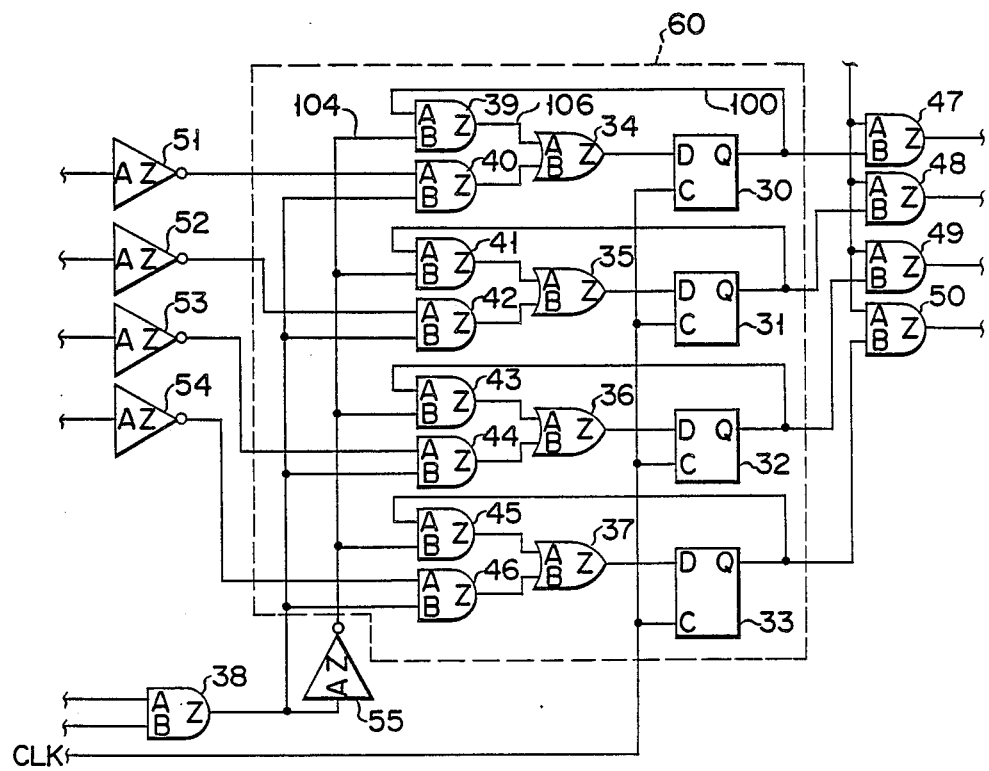
F I G. 2

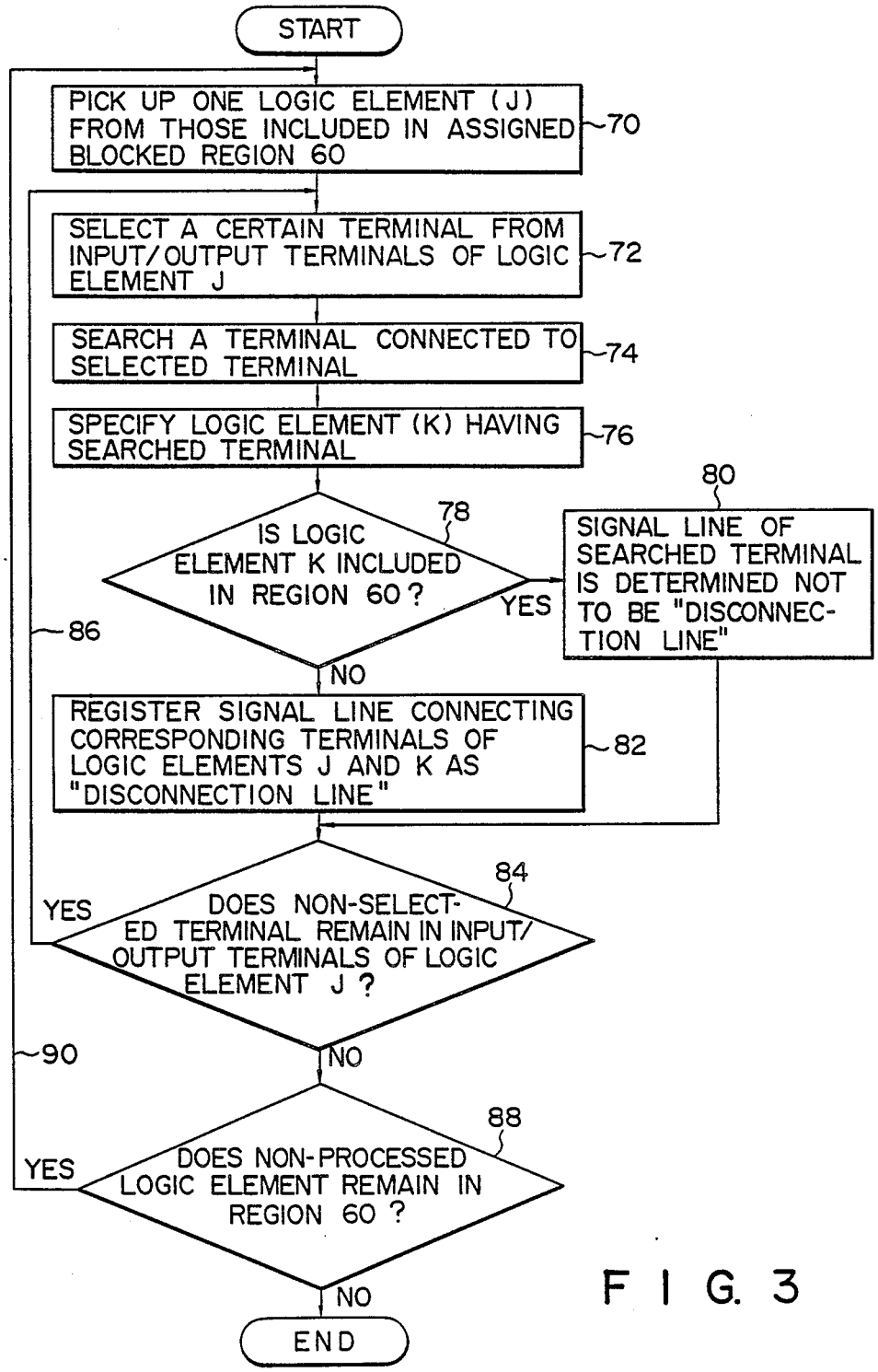
F I G. 3

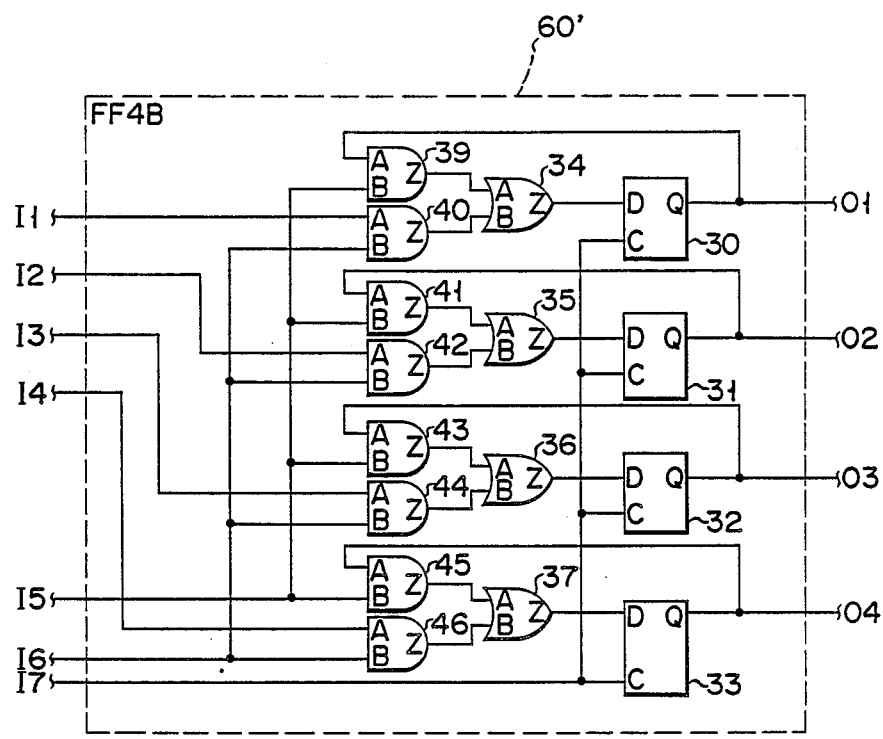
F I G. 4

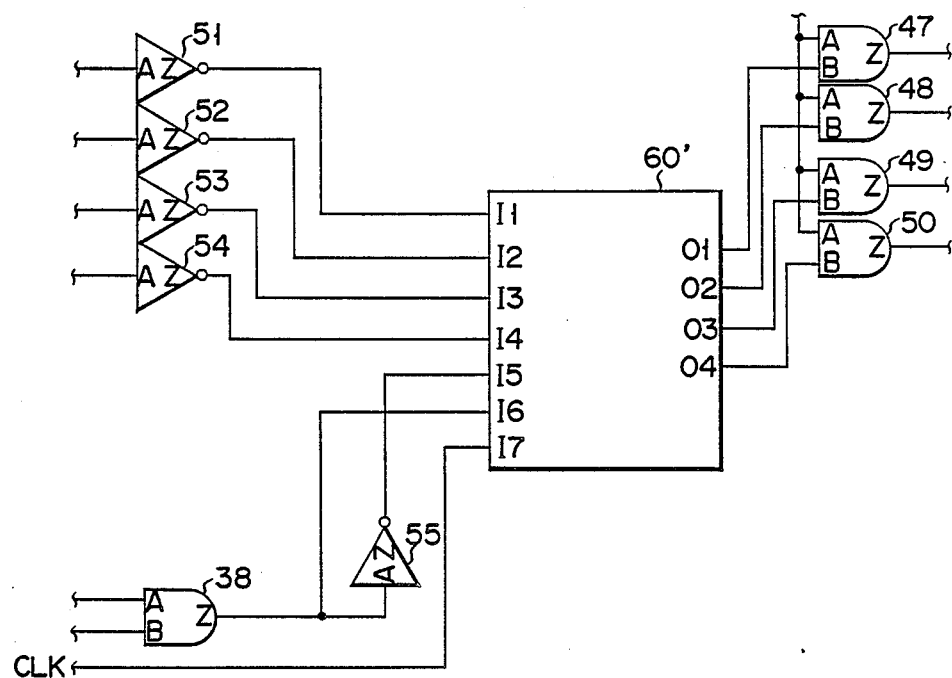
F I G. 5

COMPUTER-CONTROLLED AUTOMATIC LOGIC DESIGN SYSTEM FOR SEMICONDUCTOR INTEGRATED CIRCUIT DEVICES

BACKGROUND OF THE INVENTION

1. Field of the Invention

The present invention relates to a computer-controlled automatic logic design system for semiconductor integrated circuit devices and, more particularly, to a design automation tool for designing, based on a "hardware description language", a desired custom logic function which uses logic elements selected from standard logic elements which are known as "standard cells" and stored in advance as a library.

2. Description of the Related Art

As the size of semiconductor components such as ICs and LSIs is increased, digital computers are recently used to automatically design their internal logic circuits, thereby increasing the design efficiency. In automatic design of the internal logic circuits of LSIs, the operator or designer describes and designates the desired function or operation of the internal logic circuits by using a special computer language called "hardware description language". In an automatic logic design system, circuit elements required for real&zing the desired logic function described by the "hardware description language" are selected from standard cells stored in advance as a library and are synthesized, thereby constituting a circuit pattern that performs the designated logic operation.

Generally, a circuit which is automatically designed in the above manner cannot be directly applied to practical LSI patterns: this is due to the fact that, in the actual LSI chips, it is required that the element layout on a chip substrate must be rearranged such that (1) the layout restrictions and wiring conditions of the logic elements must be satisfied as much as possible, and (2) the entire area of the chip is minimized as much as possible by minimizing extra wiring spaces among the elements. The automatic logic design based on the "hardware description language" described above is basically directed only to automatic synthesis of the circuit for realizing a desired function, and the element layout conditions and wiring rules of an actual LSI chip are not considered. The automatic logic design system has an automatic layout processing unit, which cannot effectively obtain an optimal layout of a circuit pattern, since a currently available automatic layout algorithm is not so strong as to rearrange the constituted complex entire circuit pattern to completely satisfy the above design conditions of an actual LSI.

Therefore, according to the automatic logic design system based on the "hardware description language", after an actual entire circuit is obtained or determined, the operator or designer must carefully review the resultant entire circuit, determine the circuit element layout in order to satisfy the above conditions, and optimally rearrange the element layout based on his determination. However, when partial modification of the element layout is to be performed after the entire circuit is completed, the effect of the modification on the surrounding circuit pattern portion must also be considered, resulting in a complex, time-consuming operation.

For example, in an logic LSI such as a microprocessor, an arithmetic and logic unit (to be referred to as an "ALU" hereinafter) of the logic LSI must be placed in the vicinity of a decoder unit for generating control signals for the ALU. This layout condition aims at minimization of the signal delay between the decoder unit and the ALU, thereby maximizing the speed of the LSI logic operation. Also, when several stages of registers are constituted, they must be placed as close as possible to shorten the wirings. When the entire circuit is to be rearranged to satisfy these conditions, no extra space must remain in the rearranged circuit pattern.

As described above, according to the automatic logic design scheme based on the "hardware description language", the operator or designer does not know at all the layout of circuit at the initial stage of a design for describing a desired function of the logic circuits with the hardware description language. Therefore, at this point of time, circuit modification/designation for optimizing the layout to satisfy the design conditions of an actual LSI cannot be performed at all. According to a "blocking design scheme", a group of logic elements that must be placed close to each other is usually treated as a single "circuit block" after the wiring is completed. However, such block assignment is impossible in the design processing using the automatic logic design system described above. As a result, the operator or designer cannot effectively utilize the advantages of the design scheme.

SUMMARY OF THE INVENTION

It is therefore an object of the present invention to provide a new and improved automatic logic design assist technique for designing internal logic circuits of highly integrated semiconductor circuit devices.

It is another object of the present invention to provide a new and improved automatic logic design system which is suitable for designing internal logic circuits of highly integrated semiconductor circuit devices and which enables the operator to design an effective layout of the logic circuit.

In accordance with the above objects, the present invention is addressed to a specific automatic logic design method which is suitable for a system wherein a required logic function is automatically synthesized from "hardware description" using standard logic elements selected from a library, and then automatic layout optimization processing is performed. According to the present invention, first, the initial logic circuit which is automatically synthesized from the hardware description using standard logic elements stored in advance as a library is stored in a data storage unit. The logic circuit is at least partially displayed on a display device so that the operator can assign, among the logic elements constituting the logic circuit, those that must be grouped together as a single circuit block in order to satisfy the actual design conditions including layout restrictions for placement and wiring requirements.

When the logic elements to be grouped together are selected, they are combined as a circuit block before the logic circuit stored in the data storage unit is subjected to automatic layout optimization processing. Subsequently, the logic circuit is rearranged to include the circuit block as a circuit section having a fixed internal circuit configuration. The circuit block is prohibited from being divided into several portions during the automatic layout optimization processing.

The present invention together with its objects and advantages will become more apparent from the detailed description of the preferred embodiment to be presented below.

BRIEF DESCRIPTION OF THE DRAWINGS

In the detailed description of a preferred embodiment of the invention presented below, reference is made to the accompanying drawings of which:

FIG. 1 is a block diagram of a main portion of a system suitable for an automatic logic design system according to a preferred embodiment of the present invention;

FIG. 2 is a logic diagram of an example of the resultant circuit obtained in accordance with a computer-controlled automatic logic design system according to the preferred embodiment of the present invention;

FIG. 3 is a flowchart schematically showing the algorithm used in block assignment processing performed by a circuit-block extract unit of the automatic logic design system shown in FIG. 1;

FIG. 4 is a logic diagram showing the internal circuit arrangement of a blocked region (circuit block or circuit submodule) of the logic circuit shown in FIG. 2; and FIG. 5 is a circuit diagram showing the logic circuit of FIG. 2 which is rearranged to include the blocked region as a fixed circuit block.

DETAILED DESCRIPTION OF THE PREFERRED EMBODIMENT

Referring now to FIG. 1, an automatic logic design system in accordance with a preferred embodiment of this invention is shown which performs the internal logic circuit designing of LSIs, more specifically, the layout processing based on the "blocking design scheme" including blocking of the logic circuit. Logic circuit data which is generated by an automatic logic synthesis unit (not shown) using a "hardware description language" is supplied to circuit data storage unit 10 and stored therein.

The logic circuit data stored in storage unit 10 may be displayed on display device 12 comprising a known CRT or the like. Block assignment unit 14 is manually operated by the operator or designer to assign, among the logic elements constituting the resultant logic circuit being currently stored in data storage unit 10, a series of logic elements that must be grouped together as a "function block" (also called a "circuit submodule" or more simply a "submodule" in this field) in order to satisfy the design conditions of actual LSIs. Block assignment unit 14 may be a keyboard device and/or a graphic pointer device. The operator or designer can assign a desired blocked region with, e.g., a cursor which is movable on a display screen while he monitors the logic circuit displayed on display device 12.

Data storage unit 10 and block assignment unit 14 are connected to central processing unit (CPU) 16, which includes circuit-block extract unit 18 and circuit-block generator 20. Extract unit 18 extracts logic elements included in the region assigned by the operator using assignment unit 14 together with their connecting information from the designed circuit. Generator 20 generates the actual logic circuit of the circuit block constituted by the extracted logic elements, and rearranges or reconstructs the logic circuit data stored in data storage unit 10, to thereby generate a rearranged circuit having the circuit block as a fixed "circuit submodule", which is processed as a single circuit unit and is prohibited from being divided or disassembled in principle into several portions in the following design process. The rearranged logic circuit is then transferred to a hierarchical layout processing unit (not shown).

An automatic logic circuit design method of the present invention which is executed using the system having the above-described configuration will be described in detail. FIG. 2 shows an example of a logic circuit automatically synthesized and stored in data storage unit 10. The circuit of FIG. 2 is subjected to circuit layout optimization processing including "block assignment" in accordance with a scheme to be described below.

As shown in FIG. 2, the logic circuit is designed to include 4 flip-flop circuits 30 to 33, 4 OR gates 34 to 37, 13 AND gates 38 to 50, and 5 inverters (NOT gates) 51 to 55. It should be noted that reference symbols "A", "B", "C", "D", "Q", and "Z" in FIG. 2 designate terminals; and "CLK" designates an external input terminal.

In the initial logic circuit automatically synthesized, the logic elements included in the region surrounded by broken line 20 in FIG. 2, i.e., flip-flops 30 to 33, OR gates 34 to 37, and AND gates 39 to 46 must be arranged as closely as possible in an actual LSI chip substrate in order to improve the signal transfer and circuit characteristics. When these logic elements are to be subjected to block assignment, the operator or designer assigns blocked region 60 using block assignment unit 14 while he monitors the image of the circuit arrangement displayed on display device 12, as shown in FIG. 2.

In this case, using block assignment unit 14, the operator inputs the name of the region that includes the logic elements to be grouped together as blocked region 60, i.e., a command defining the block "FF4B" and a command defining the logic elements included in the region, in accordance with the following manner:

| TYPE | FF4B; |
|---|---|
| ELEM | 30, 31, 32, 33, 34, 35, 36, 37, 39, 40, 41 42, 43, 44, 45, 46; |

When the command input is completed, the assignment of blocked region 60 is determined.

Circuit-block extract unit 18 recognizes obtained blocked region 60 in an algorithm manner, extracts the portion corresponding to the assigned region from the logic circuit data stored in data storage unit 10, and detects signal lines that are disconnected by the boundary or envelope of blocked region 60, i.e., the signal lines connecting between the logic elements included in blocked region 60 and the logic elements surrounding blocked region 60. Each of the detected signal lines is registered as a "disconnection line" for blocked region 60.

FIG. 3 is a flowchart showing the algorithm of the extraction process of circuit-block extract unit 18 for extracting blocked region 60. First, circuit-block extract unit 18 picks up certain logic element J among the logic elements included in blocked region 60 assigned using block assignment unit 14 (step 70). Subsequently, one of the input/output terminals of logic element J is selected (step 72). One terminal to which the selected terminal of logic element J is connected is searched (step 74), and logic element K having the searched terminal is specified (step 76). Logic element K is then checked to determine whether it is included in blocked region 60 (step 78).

If YES in step 78, it is determined that a signal line connecting these terminals is not a "disconnection line"

(step 80). If NO in step 78, a signal line connecting the corresponding terminals of logic elements J and K that are connected to each other is registered as a "disconnection line" (step 82). At this time, the input/output terminals of logic element J are checked to determine whether a nonselected terminal remains therein (step 84). If YES in step 84, the flow returns to step 72 along arrow 86 in FIG. 3 and the above process is repeated. Then, it is checked whether the above process is completed for all the logic elements in blocked region 60 (step 88). If a nonprocessed logic element remains in blocked region 60, i.e., if YES in step 88, the flow returns to step 70 along arrow 90 in FIG. 3. The above blocking process is repeated until the "disconnection lines" of all the logic elements in blocked region 60 are completed.

In step 70, when AND gate 39 shown in FIG. 2 is extracted, terminal A is extracted first. Terminal A is connected to terminal Q of flip-flop 30 in the example shown in FIG. 2. It is checked whether logic elements 30 is included in blocked region 60, and it is confirmed that flip-flop 30 is included in blocked region 60. Therefore, it is found that signal line 100 shown in FIG. 2 is not a "disconnection line". Signal line 100 is not regarded as a "disconnection line". Subsequently, another terminal, e.g., input terminal B, of AND gate 39 is selected and processed in a similar manner as that described above. As a result, signal line 104 is registered (memorized) as a "disconnection line" of blocked region 60, since inverter 55 connected to input terminal B of AND gate 39 is not included in blocked region 60. OR gate 34 connected to output terminal Z of AND gate 39 is a logic element included in blocked region 60, so that signal line 106 connecting OR gate 34 and AND gate 39 is not regarded as a "disconnection line".

The following Table shows the signal lines serving as the "disconnection lines" of blocked region 60 which are registered in accordance with the above manner.

TABLE

| Element Name 1 | Terminal Name 1 | Element Name 2 | Terminal Name 2 |
| --- | --- | --- | --- |
| 30 | Q | 47 | B |
|    | C |    | CLK |
| 31 | Q | 48 | B |
|    | C |    | CLK |
| 32 | Q | 49 | B |
|    | C |    | CLK |
| 33 | Q | 50 | B |
|    | C |    | CLK |
| 39 | B | 55 | Z |
| 40 | A | 51 | Z |
|    | B | 38 | Z |
| 41 | B | 55 | Z |
| 42 | A | 52 | Z |
|    | B | 38 | Z |
| 43 | B | 55 | Z |
| 44 | A | 53 | Z |
|    | B | 38 | Z |
| 45 | B | 55 | Z |
| 46 | A | 54 | Z |
|    | B | 38 | Z |

As is apparent from the above Table, signal lines connecting the terminals, defined by "terminal name 1", of logic elements within blocked region 60 and defined by "logic element name 1" and the terminals, defined by "terminal name 2", of logic elements located around region 60 and defined by "logic element name 2" are registered as "disconnection lines".

Blocked region 60 is extracted from the logic circuit shown in FIG. 2 using the disconnection line data shown in the above Table obtained by circuit-block extract unit 18, and thus forms a circuit block having the above disconnection lines as external input/output terminals. The name (or "type name") of this circuit block is "FF4B" which is already assigned by block assignment unit 14. In this case, identification codes are given to the respective input/output terminals of the circuit block.

FIG. 4 illustrates a rearranged circuit configuration of the resultant circuit-block 60' named "FF4B". In circuit block 60', identification codes "I1" to "I7" are given to the respective block input terminals connected to the signal lines of AND gates 39 to 46 and terminal C of flip-flop 33. Identification codes "O1" to "O4" are given to the block output terminals connected to the signal lines of terminals Q of flip-flops 30 to 33.

After the "disconnection lines" of blocked region 60 are determined, circuit-block generator 20 defines assigned blocked region 60 in the logic circuit of FIG. 2 using the disconnection line data based on the circuit information stored in data storage unit 10. Generator 20 further modifies or reconstructs the logic circuit of FIG. 2 such that it includes blocked region 60 as a fixed circuit submodule. FIG. 5 shows the logic circuit which corresponds to that of FIG. 2 and which is generated by generator 20, wherein blocked region 60 is regarded as the fixed circuit submodule. In the following design process, therefore, the circuit included in blocked region 60' is processed as an independent circuit submodule which has input/output terminals and which is not dividable. The logic elements included in blocked region 60' are prohibited from being arranged separately in a later automatic layout optimization process. In other words, conditions for grouping the logic elements corresponding to blocked region 60 and prohibiting the group from being divided are added to the logic circuit information of data storage unit 10 before the automatic layout processing step.

According to the automatic logic design method of the present invention, when an operator or designer designs an internal logic circuit of an LSI using a computer-controlled design tool in an interactive manner, he designates (performs blocking design) the grouping of partial logic elements in order to satisfy the layout restrictions of the logic elements and the design conditions (wiring conditions among the logic elements) before the automatic layout optimization processing is performed, so that region 60 corresponding to the circuit block or circuit submodule can be registered in the currently obtained logic circuit. Therefore, even in an automatic logic design system based on the "hardware description language", an optimum layout design, which maximally satisfies the conditions including minimization of the layout area of the entire logic circuit pattern of an actual LSI and minimization of a signal delay on wirings, can be effectively performed.

Furthermore, according to the present invention, an extra work to write a "hardware description language" considering the logic elements and their layout design is not needed at the stage of designing function of the circuit. Therefore, the operator or designer can concentrate on the primary logic design operation, resulting in an increase in logic design operation efficiency.

Furthermore, according to the present invention, when "circuit block" 60 is to be assigned within a logic circuit synthesized and stored in data storage unit 12, automatically detected signal lines connecting logic elements included in the circuit block and surrounding logic elements not included in the circuit block are registered (memorized) as "disconnection lines", thereby accurately defining blocked region 60. The internal logic circuit of defined blocked region 60 is automatically placed and wired, and is then registered as a circuit block having a single fixed element layout. Therefore, the efficiency in designing the block can be increased while a load on the operator required for assigning circuit block 60 can be minimized.

Although the invention has been described with reference to a specific embodiment, it shall be understood by those skilled in the art that numerous modifications may be made that are within the spirit and scope of the inventive contribution.

For example, blocked region 60 can be assigned not based on the logic elements included in it but directly by using the "disconnection lines" described above. In this case, the assignment of a blocked region may be further simplified.

What is claimed is:

1. A computer-controlled automatic logic design method comprising the steps of:
   (a) storing in a data storage unit a logic circuit which is automatically synthesized based on a hardware description language by using standard logic elements which have been stored as a library;
   (b) at least partially displaying the logic circuit on a display device to permit an operator to assign, among logic elements constituting the logic circuit, those which are necessary to be grouped together as a circuit block in order to satisfy actual design conditions including restrictions for placement and wiring;
   (c) combining, when said logic elements to be grouped together are selected by an operator, these selected logic elements as a circuit block, before said logic circuit stored in said data storage unit is subjected to automatic layout optimization processing to thereby generate a circuit section having a fixed integral circuit arrangement which is prevented from being modified; and
   (d) rearranging said logic circuit stored in said data storage unit including said circuit block in such a manner that the internal circuit arrangement of said circuit block is kept continuously unchanged, whereby said circuit block is prohibited from being divided into several portions in the automatic layout optimization processing.

2. The method according to claim 1, wherein said circuit block is defined, in said logic circuit, by detecting signal lines connecting logic elements included therein and logic elements located outside said circuit block and specifying detected signal lines.

3. The method according to claim 2, wherein said detected signal lines are identified as input/output terminals of said circuit block.

4. The method according to claim 3, wherein said detected signal lines are given code names for identification.

5. The method according to claim 4, wherein said circuit block is given a code name for identification.

6. A computer-controlled apparatus for automatic logic design using hardware description language, said apparatus comprising:
   (a) data storage means for storing a logic circuit which is automatically synthesized based on the hardware description language using standard logic elements which have been stored as a library;
   (b) display means for at least partially displaying said logic circuit;
   (c) assignment means, manually operated by an operator, for assigning, among logic elements constituting said logic circuit, those required to be grouped together as a circuit block in order to satisfy actual design conditions including restrictions for placement and wiring;
   (d) first processing means, connected to said assignment means, for combining, when said logic elements to be grouped together are selected by an operation using said assignment means, these selected logic elements as a circuit block, before said logic circuit stored in said data storage means is subjected to automatic layout optimization processing to thereby generate a circuit section having a fixed internal circuit arrangement which is prevented from being modified; and
   (e) second processing means, connected to said first processing means, for rearranging said logic circuit stored in said data storage means including said circuit block in such a manner that the internal circuit arrangement of said circuit block is kept continuously unchanged, whereby said circuit block is prohibited from being divided into several portions in the automatic layout optimization processing.

7. The apparatus according to claim 6, wherein said first processing means detects signal lines connecting logic elements included in said circuit block and logic elements located outside said circuit block, and specifies detected signal lines, thereby defining a blocked region corresponding to said circuit block within said logic circuit.

8. The apparatus according to claim 7, wherein said first and second processing means are embedded in a central processing unit.

9. The apparatus according to claim 7, wherein said assignment means comprises at least one of a keyboard and a pointer.

* * * * *